United States Patent
Lin et al.

(10) Patent No.: US 11,818,966 B2
(45) Date of Patent: Nov. 14, 2023

(54) RESISTIVE RANDOM ACCESS MEMORY AND MANUFACTURING METHOD THEREOF

(71) Applicant: United Microelectronics Corp., Hsinchu (TW)

(72) Inventors: Yi Yu Lin, Taichung (TW); Po Kai Hsu, Tainan (TW); Chun-Hao Wang, Taipei (TW); Yu-Ru Yang, Hsinchu County (TW); Ju Chun Fan, Tainan (TW); Chung Yi Chiu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 129 days.

(21) Appl. No.: 17/541,280

(22) Filed: Dec. 3, 2021

(65) Prior Publication Data

US 2023/0135098 A1 May 4, 2023

(30) Foreign Application Priority Data

Nov. 4, 2021 (CN) .......................... 202111300233.X

(51) Int. Cl.
*G11C 13/00* (2006.01)
*H10N 70/00* (2023.01)
*H10B 63/00* (2023.01)

(52) U.S. Cl.
CPC ........... *H10N 70/043* (2023.02); *H10B 63/30* (2023.02); *H10N 70/061* (2023.02); *H10N 70/841* (2023.02); *H10N 70/861* (2023.02)

(58) Field of Classification Search
None
See application file for complete search history.

(56) References Cited

U.S. PATENT DOCUMENTS

| | | | |
|---|---|---|---|
| 9,524,755 B1 * | 12/2016 | Naito | G11C 16/0466 |
| 10,468,503 B1 * | 11/2019 | Balakrishnan | H01L 29/7884 |
| 2013/0270508 A1 | 10/2013 | Li et al. | |
| 2015/0144866 A1 * | 5/2015 | Masuoka | H10N 70/011 438/238 |
| 2015/0372135 A1 * | 12/2015 | Park | H01L 29/66666 257/329 |
| 2021/0399048 A1 * | 12/2021 | Wu | H10B 63/34 |

* cited by examiner

*Primary Examiner* — Tan T. Nguyen
(74) *Attorney, Agent, or Firm* — JCIPRNET

(57) ABSTRACT

Provided are a resistive random access memory and a manufacturing method thereof. The resistive random access memory includes a substrate having a pillar protruding from a surface of the substrate, a gate surrounding a part of a side surface of the pillar, a gate dielectric layer, a first electrode, a second electrode, a variable resistance layer, a first doped region and a second doped region. The gate dielectric layer is disposed between the gate and the pillar. The first electrode is disposed on a top surface of the pillar. The second electrode is disposed on the first electrode. The variable resistance layer is disposed between the first electrode and the second electrode. The first doped region is disposed in the pillar below the gate and in a part of the substrate below the pillar. The second doped region is disposed in the pillar between the gate and the first electrode.

16 Claims, 9 Drawing Sheets

RESISTIVE RANDOM ACCESS MEMORY AND MANUFACTURING METHOD THEREOF

CROSS-REFERENCE TO RELATED APPLICATION

This application claims the priority benefit of China application serial no. 202111300233.X, filed on Nov. 4, 2021. The entirety of the above-mentioned patent application is hereby incorporated by reference herein and made a part of this specification.

BACKGROUND

Technical Field

The present invention relates to a memory and a manufacturing method thereof, and particularly to a resistive random access memory (ReRAM) and a manufacturing method thereof.

Description of Related Art

The resistive random access memory has the advantages of high operation speed and low power consumption, and thus has become a kind of non-volatile memory widely studied in recent years. Generally speaking, the memory structure in a resistive random access memory includes an upper electrode, a lower electrode and a variable resistance layer disposed between the upper electrode and the lower electrode.

During the operation of the resistive random access memory, when voltages are applied to the upper electrode and the lower electrode, a conductive path, usually called a conductive filament (CF), may be formed in the variable resistance layer for a set operation, or to make the conductive path disconnect for a reset operation, to provide related memory functions.

In the current resistive random access memory that includes a single transistor and a single memory structure (1T1R), the transistor and the memory structure are usually disposed in different regions. Therefore, the cell density of the resistive random access memory cannot be effectively increased, making the size of the resistive random access memory unable to be further reduced.

SUMMARY

The present invention provides a resistive random access memory, in which the transistor and the resistive random access memory structure are integrated in the pillar protruding from the surface of the substrate.

The present invention provides a manufacturing method of a resistive random access memory, in which the manufacturing of the transistor and the resistive random access memory structure are integrated.

A resistive random access memory of the present invention includes a substrate, a gate, a gate dielectric layer, a first electrode, a second electrode, a variable resistance layer, a first doped region and a second doped region. The substrate has a pillar protruding from a surface of the substrate. The gate surrounds a part of a side surface of the pillar. The gate dielectric layer is disposed between the gate and the pillar. The first electrode is disposed on a top surface of the pillar. The second electrode is disposed on the first electrode. The variable resistance layer is disposed between the first electrode and the second electrode. The first doped region is disposed in the pillar below the gate and in a part of the substrate below the pillar. The second doped region is disposed in the pillar between the gate and the first electrode.

In an embodiment of the resistive random access memory of the present invention, the resistive random access memory further includes a metal silicide layer disposed between the pillar and the first electrode.

In an embodiment of the resistive random access memory of the present invention, the metal silicide layer includes a titanium silicide layer, a tungsten silicide layer, a tantalum silicide layer, a molybdenum silicide layer, a cobalt silicide layer, a nickel silicide layer or a combination thereof.

In an embodiment of the resistive random access memory of the present invention, the resistive random access memory further includes a contact connecting the first doped region.

In an embodiment of the resistive random access memory of the present invention, the resistive random access memory further includes a contact connecting to the gate.

In an embodiment of the resistive random access memory of the present invention, a material of the first electrode includes Ti, Ta, TiN, TaN, TiAlN, TiW, Pt, Ir, W, Ru, graphite or a combination thereof.

In an embodiment of the resistive random access memory of the present invention, a material of the second electrode includes Ti, Ta, TiN, TaN, TiAlN, TiW, Pt, Ir, W, Ru, graphite or a combination thereof.

In an embodiment of the resistive random access memory of the present invention, a material of the variable resistance layer includes TaO, $HfO_2$, $ZrO_2$, HfZrO, HfAlO, HfON, HfSiO, HfSrO, HfYO or a combination thereof.

In an embodiment of the resistive random access memory of the present invention, a material of the gate includes metal or doped polysilicon.

In an embodiment of the resistive random access memory of the present invention, the resistive random access memory further includes a hardmask layer disposed on the second electrode.

In an embodiment of the resistive random access memory of the present invention, the hardmask layer includes a titanium nitride layer, a tantalum nitride layer or a combination thereof.

A manufacturing method of a resistive random access memory of the present invention includes the following steps. A first conductive layer, a variable resistance material layer, a second conductive layer and a hardmask material layer are formed sequentially on a substrate. The substrate, the first conductive layer, the variable resistance material layer, the second conductive layer and the hard mask material layer are patterned to form a pillar protruding from a surface of the substrate, a resistive random access memory structure on the pillar and a hardmask layer on the resistive random access memory structure. A gate structure surrounding a part of the side surface of the pillar, a first doped region in the pillar under the gate structure and in a part of the substrate under the pillar, and a second doped region in the pillar between the gate structure and the resistive random access memory structure are formed to form a nanowire transistor. The nanowire transistor is electrically connected to the resistive random access memory structure.

In an embodiment of the manufacturing method of the resistive random access memory of the present invention, before forming the first conductive layer, the manufacturing method further includes the following steps. A metal layer is formed on the substrate. A heat-treatment is performed on the metal layer to form a metal silicide layer.

In an embodiment of the manufacturing method of the resistive random access memory of the present invention, the method for forming the nanowire transistor includes the following steps. Dopants are implanted in the substrate before forming the first conductive layer to form the second doped region after the patterning process. Dopants are implanted in a lower portion of the pillar and in a portion of the substrate under the pillar after forming the pillar to form the first doped region. A dielectric layer is formed to cover the lower portion of the pillar on the substrate. An oxide layer is formed on a exposed side surface of the pillar. A third conductive layer is formed on the dielectric layer, wherein the third conductive layer surrounds the oxide layer under the second doped region.

In an embodiment of the manufacturing method of the resistive random access memory of the present invention, the method for forming the oxide layer includes a thermal oxidation process.

In an embodiment of the manufacturing method of the resistive random access memory of the present invention, the method for forming the third conductive layer includes the following steps. A conductive material layer is formed to cover the pillar on the dielectric layer. The conductive material layer is patterned.

In an embodiment of the manufacturing method of the resistive random access memory of the present invention, the method for forming the dielectric layer includes the following steps. A protective layer is formed on the side surface of the pillar, the side surface of the resistive random access memory structure and the surface of the substrate after forming the first doped region. A dielectric material layer is formed on the substrate, wherein the dielectric material layer covers the pillar, the resistive random access memory structure and the hardmask layer. A part of the dielectric material layer and a part of the protective layer are removed to expose a part of the side surface of the pillar.

In an embodiment of the manufacturing method of the resistive random access memory of the present invention, after forming the nanowire transistor, the manufacturing method further includes the following steps. An interlayer dielectric layer is formed on the substrate, wherein the interlayer dielectric layer covers the nanowire transistor, the resistive random access memory structure and the hardmask layer. A first contact connecting the first doped region in the substrate and a second contact connecting the gate structure are formed in the interlayer dielectric layer.

Based on the above, the resistive random access memory of the present invention includes a transistor and a resistive random access memory structure disposed on and electrically connected to the transistor. In addition, the transistor and the resistive random access memory structure are integrated at the pillar protruding from the surface of the substrate. Therefore, the cell density of the resistive random access memory may be effectively increased.

In addition, in the manufacturing method of the resistive random access memory of present invention, since the manufacturing of the transistor and the resistive random access memory structure are integrated, the manufacturing of the resistive random access memory is simplified.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
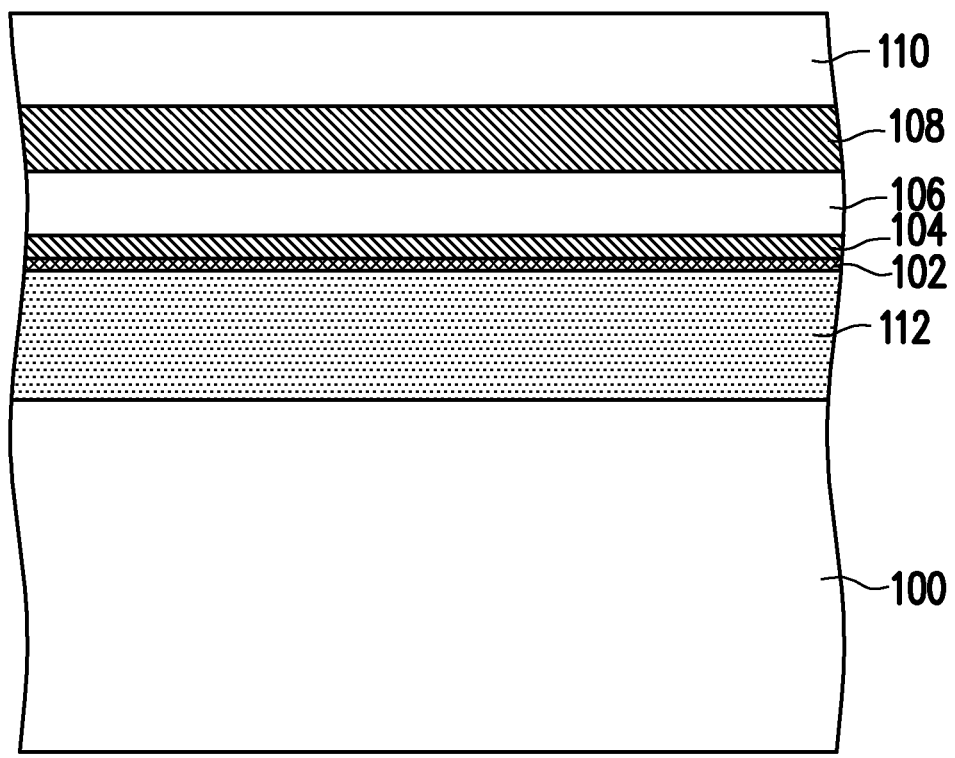
FIGS. 1A to 1E are schematic cross-sectional schematic diagrams of a manufacturing process of a resistive random access memory according to an embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

In addition, the directional terms, such as "on", "above", "under" and "below" mentioned in the text are only used to refer to the direction of the drawings, and are not used to limit the present invention.

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

FIGS. 1A to 1E are schematic cross-sectional schematic diagrams of a manufacturing process of a resistive random access memory according to an embodiment of the present invention.

Referring to FIG. 1A, a substrate 100 is provided. In the present embodiment, the substrate 100 is a silicon substrate, but the present invention is not limited thereto. In other embodiments, the substrate 100 may be a silicon on insulator (SOI) substrate. Then, the first conductive layer 104, the variable resistance material layer 106 and the second conductive layer 108 are sequentially formed on the substrate 100. In addition, in the present embodiment, before forming the first conductive layer 104, the metal layer 102 may be formed on the substrate 100, but the present invention is not limited thereto. In addition, after the second conductive layer 108 is formed, the hardmask material layer 110 may be formed on the second conductive layer 108, but the present invention is not limited thereto.

In the present embodiment, the metal layer 102 may be a titanium layer, a tungsten layer, a tantalum layer, a molybdenum layer, a cobalt layer, a nickel layer or a combination thereof, but the present invention is not limited thereto. In the present embodiment, the material of the first conductive layer 104 may be Ti, Ta, TiN, TaN, TiAlN, TiW, Pt, Ir, W, Ru, graphite or a combination thereof, but present invention does not Limited thereto. The first conductive layer 104 is used to form the lower electrode in the memory structure. In the present embodiment, the material of the variable resistance material layer 106 may be TaO, HfO₂, ZrO₂, HfZrO, HfAlO, HfON, HfSiO, HfSrO, HfYO or a combination thereof, but present invention is not limited thereto. The variable resistance material layer 106 is used to form the variable resistance layer in the memory structure. In the present embodiment, the material of the second conductive layer 108 may be Ti, Ta, TiN, TaN, TiAlN, TiW, Pt, Ir, W, Ru, graphite or a combination thereof, but present invention does not limited thereto. The second conductive layer 108 is used to form the upper electrode in the memory structure. In the present embodiment, the hardmask material layer 110 is a conductive layer, such as a titanium nitride layer, a tantalum nitride layer or a combination thereof, but the present invention is not limited thereto. In other embodiments, the hardmask material layer 110 may be an insulating layer, such as a silicon nitride layer.

In addition, in the present embodiment, before forming the metal layer 102, dopants are implanted into the substrate 100 to form the doped region 112. The doped region 112 extends from the surface of the substrate 100 toward the inside of the substrate 100. In other embodiments, the doped region 112 may be formed in other steps, which is not limited by the present invention.

Figure 1B:
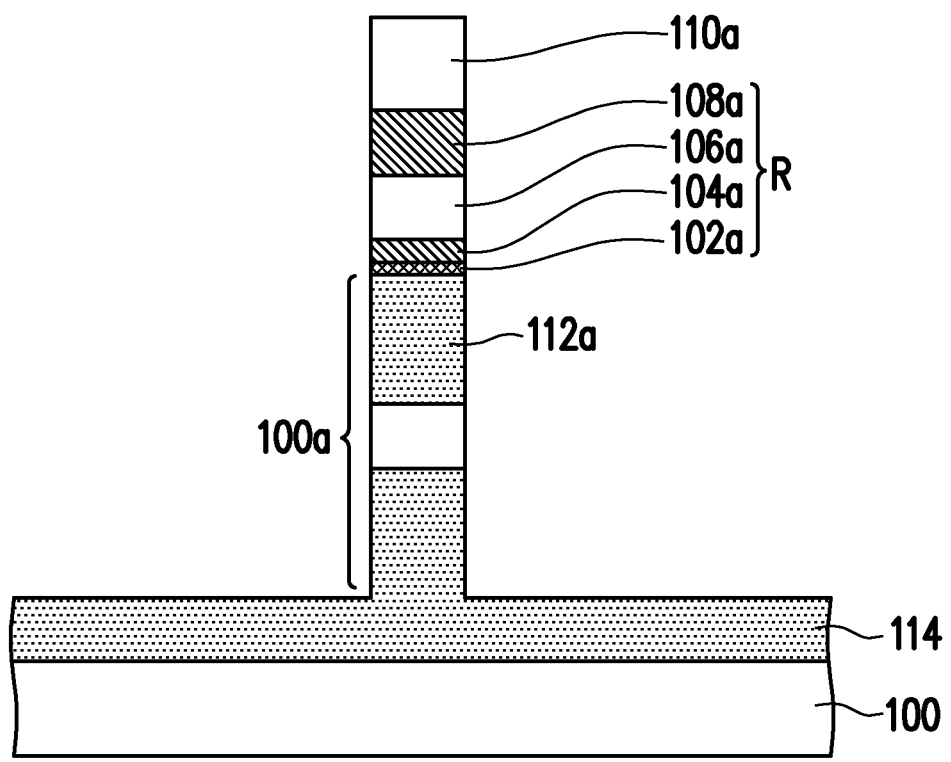

Referring to FIG. 1B, a heat-treatment is performed on the metal layer 102 to make the metal layer 102 react with the silicon in the substrate 100 to form a metal silicide layer. The heat-treatment is, for example, an annealing process. In other embodiments, the metal layer 102 may be heat-treated in other subsequent steps, which is not limited by the present invention. Then, a patterning process is performed on the substrate 100, the metal silicide layer, the first conductive layer 104, the variable resistance material layer 106, the second conductive layer 108, and the hardmask material layer 110 to form a pillar 100a protruding from the surface of the substrate 100 and the metal silicide layer 102a, the first electrode 104a, the variable resistance layer 106a, the second electrode 108a and the hardmask layer 110a sequentially stacked on the pillar 100a. In the present embodiment, the metal silicide layer 102a, the first electrode 104a, the variable resistance layer 106a and the second electrode 108a constitute the resistive random access memory structure R, wherein the metal silicide layer 102a and the first electrode 104a together serve as the lower electrode, and the second electrode 108a serves as the upper electrode.

In addition, after performing the patterning process, the doped region 112 in the substrate 100 forms a doped region 112a located in the upper portion of the pillar 100a.

After the pillar 100a is formed, dopants may be implanted into the lower portion of the pillar 100a and a part of the substrate 100 under the pillar 100a to form the doped region 114. The doped region 114 and the doped region 112 have the same conductivity type. In addition, in the pillar 100a, the doped region 112 and the doped region 114 are separated from each other. In other embodiments, the doped region 114 may be formed in other steps, which is not limited by the present invention.

Figure 1C:
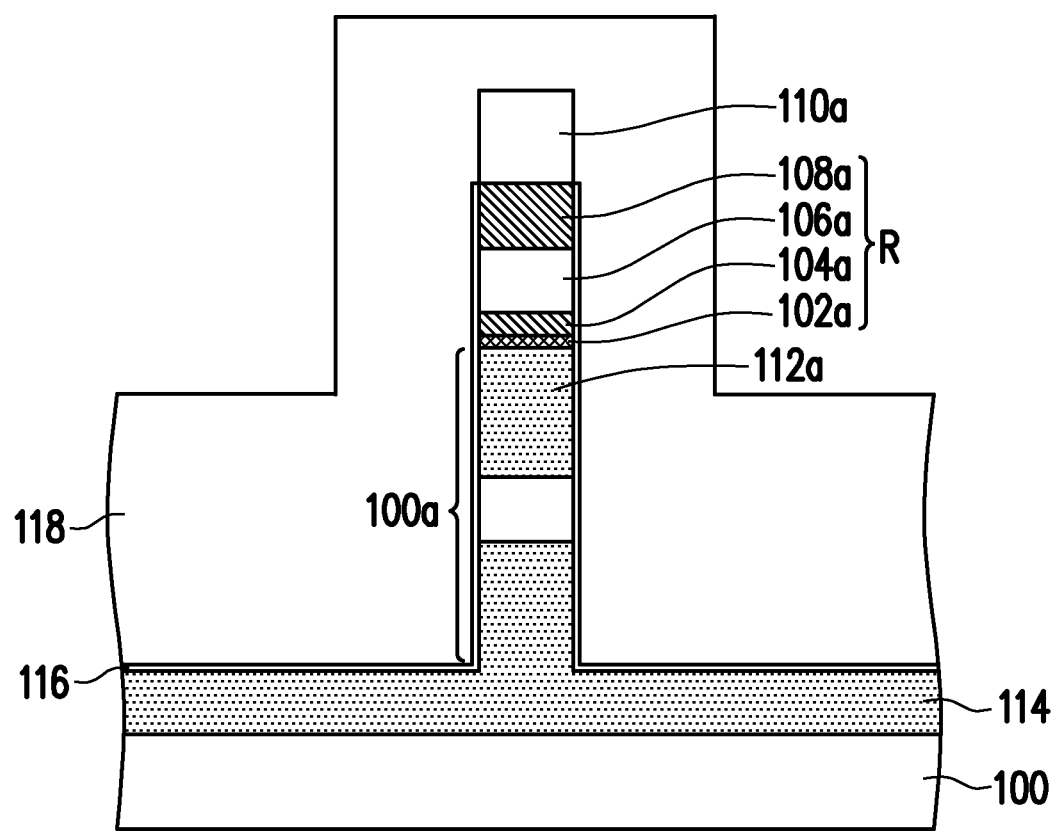

Referring to FIG. 1C, the protective layer 116 is formed on the side surface of the pillar 100a, the side surface of the resistive random access memory structure R and the surface of the substrate 100. The protective layer 116 is used to prevent the pillar 100a, the resistive random access memory structure R and the substrate 100 from being damaged in the subsequent manufacturing process. The protective layer 116 is, for example, an oxide layer. The forming method of the protective layer 116 is, for example, a thermal oxidation process. In the present embodiment, the protective layer 116 is not formed on the side surface of the hardmask layer 110a. In other embodiments, depending on the material of the hardmask layer 110a, the protective layer 116 may be formed on the side surface of the hardmask layer 110a. After that, the dielectric material layer 118 is formed on the substrate 100. The dielectric material layer 118 covers the pillar 100a, the resistive random access memory structure R and the hardmask layer 110a. The dielectric material layer 118 is, for example, an oxide layer. The forming method of the dielectric material layer 118 is, for example, a chemical vapor deposition (CVD) process.

Figure 1D:
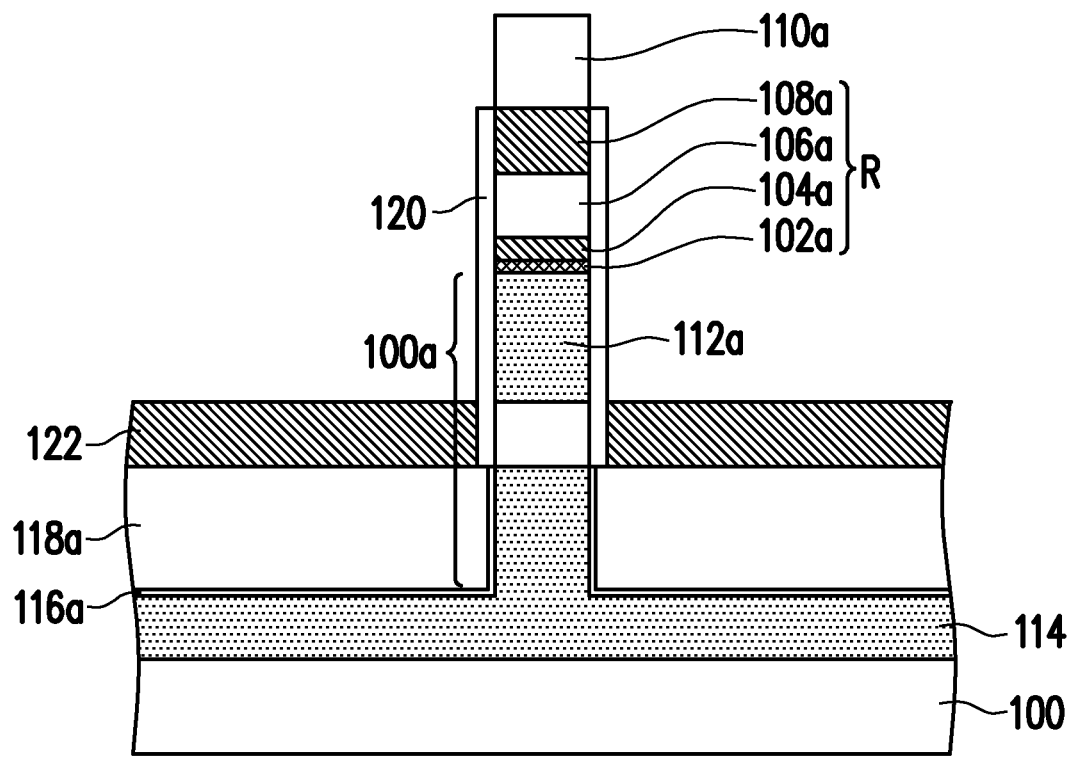

Referring to FIG. 1D, a part of the dielectric material layer 118 and a part of the protective layer 116 are removed to form the dielectric layer 118a and the protective layer 116a, and a part of the side surface of the pillar 100a is exposed. The method for removing the part of the dielectric material layer 118 and the part of the protective layer 116 is, for example, an etching-back process. After removing the part of the dielectric material layer 118 and the part of the protective layer 116, the top surfaces of the formed dielectric layer 118a and the protective layer 116a are substantially coplanar with the top surface of the doped region 114 located in the pillar 100a. In other words, the dielectric layer 118a and the protective layer 116a cover the lower portion of the pillar 100a. Then, the oxide layer 120 is formed on the exposed side surface of the pillar 100a. The forming method of the oxide layer 120 is, for example, a thermal oxidation process. Next, the conductive material layer 122 is formed on the dielectric layer 118a. The conductive material layer 122 is, for example, a metal layer or a doped polysilicon layer. The conductive material layer 122 surrounds the oxide layer 120 under the doped region 112a. In other words, since the top surface of the dielectric layer 118a and the top surface of the doped region 114 located in the pillar 100a are substantially coplanar, the conductive material layer 122 surrounds the oxide layer 120 located between the doped region 112a and the doped region 114.

Figure 1E:
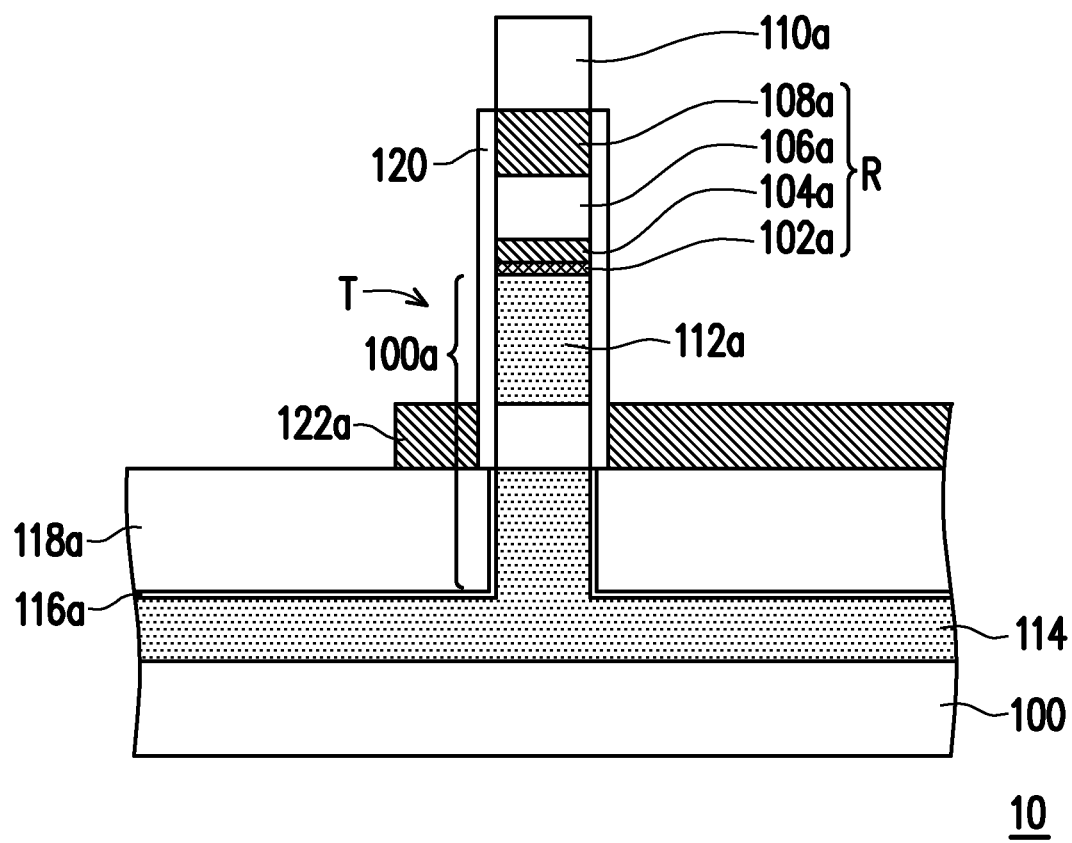
Figure 2:
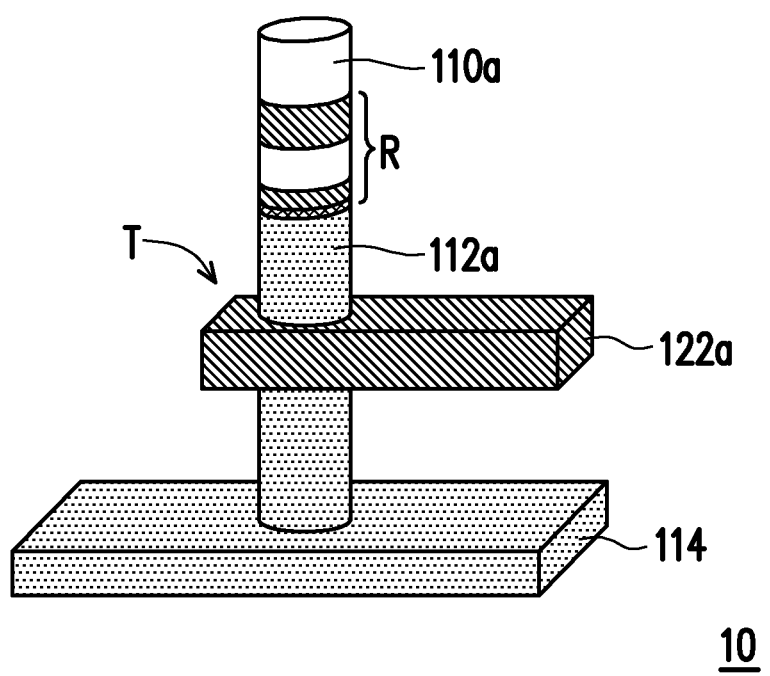
FIG. 2 is a three-dimensional view of the resistive random access memory in FIG. 1E.

Referring to FIG. 1E, the conductive material layer 122 is patterned to form a conductive layer 122a surrounding a part of the pillar 100a between the doped region 112a and the doped region 114. In this way, the manufacture of the resistive random access memory 10 of the present embodiment is completed. FIG. 2 is a three-dimensional view of the resistive random access memory 10. In FIG. 2, for the purpose of clarity of the drawing and ease of description, the substrate 100, the protective layer 116a, the dielectric layer 118a and the oxide layer 120 are not shown. As shown in FIG. 2, the conductive layer 122a is a strip-shaped conductive layer, and surrounds the part of the pillar 100a located between the doped region 112a and the doped region 114.

In the resistive random access memory 10, the doped region 112a, the doped region 114, the oxide layer 120, the conductive layer 122a and the part of the pillar 100a located between the doped region 112a and the doped region 114 constitute the transistor T. In the present embodiment, since the transistor T has a pillar 100a as the main body and has a nanometer-level size, the transistor T may be called a nanowire transistor. In the transistor T, the conductive layer 122a acts as a gate, the doped region 112a acts as a drain, the doped region 114 acts as a source, the part of pillar 100a between the doped region 112a and the doped region 114 acts as a channel region, the part of the oxide layer 120 between the conductive layer 122a and the channel region serves as a gate dielectric layer, and the conductive layer 122a and the oxide layer 120 constitute a gate structure.

In this way, the resistive random access memory 10 consists of the transistor T and the resistive random access memory structure R disposed on the transistor T, and the metal silicide layer 102a in the resistive random access memory structure R is connected to the doped region 112a in the transistor T, so that the transistor T is electrically connected to the resistive random access memory structure R. That is, in the resistive random access memory 10 of the present embodiment, the transistor T and the resistive random access memory structure R may be integrated at the pillar 100a, so that the cell density of the resistive random access memory 10 may be effectively increased, and thus the resistive random access memory 10 may achieve the purpose of downsizing. In addition, the manufacturing of the transistor T and the resistive random access memory structure R may be integrated, and thus the manufacturing of the resistive random access memory 10 may be simplified.

Figure 3A:
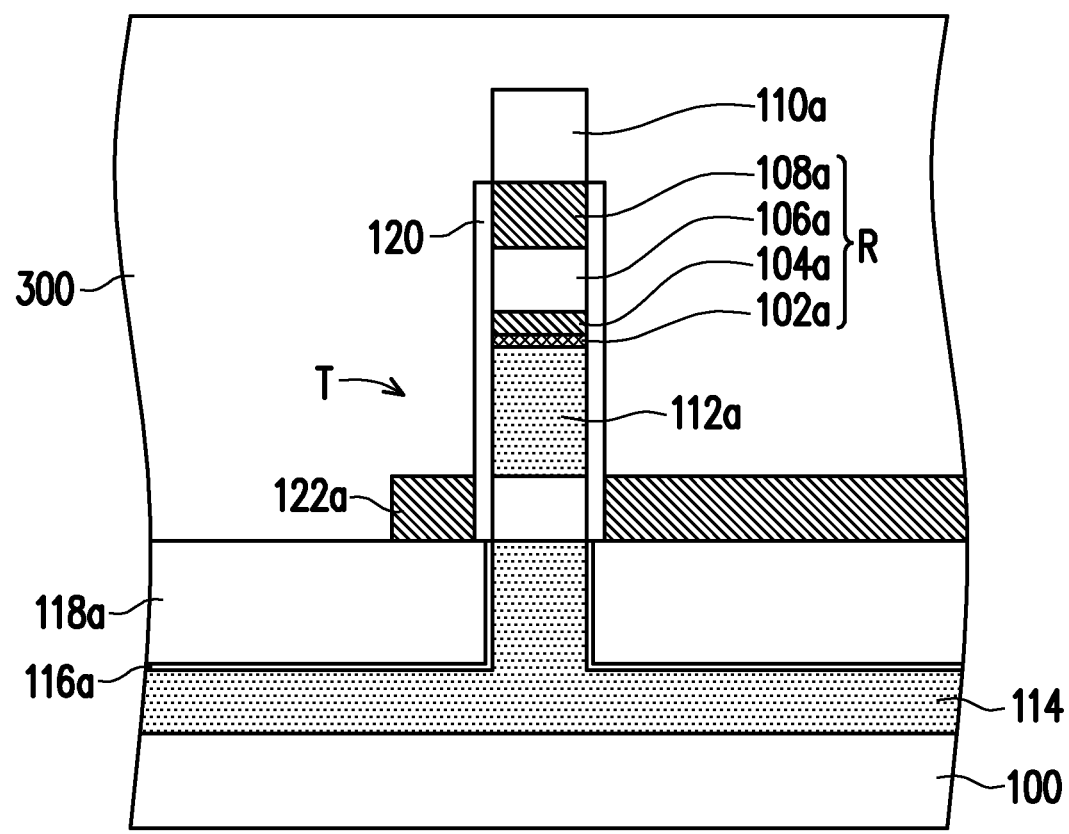
FIGS. 3A to 3B are schematic cross-sectional views of a manufacturing process of a resistive random access memory according to another embodiment of the present invention.
Figure 3B:
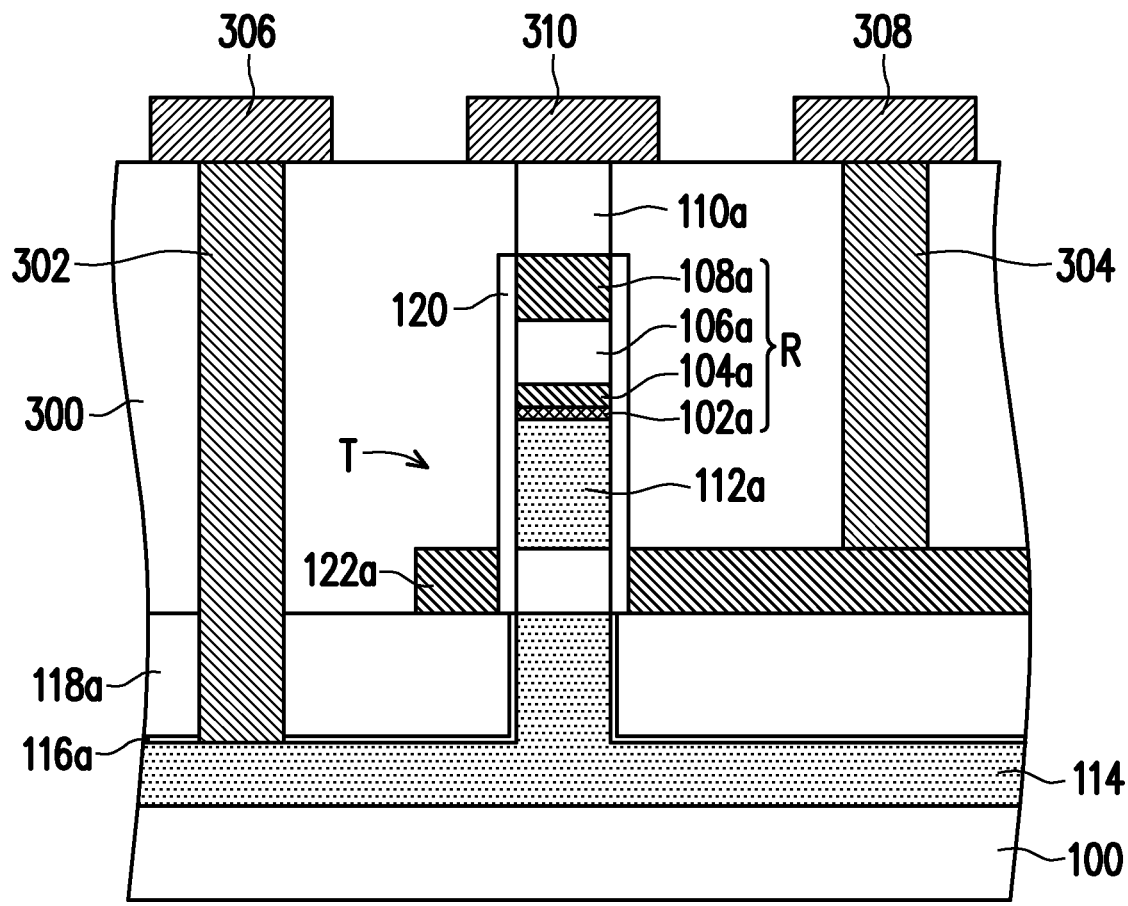

FIGS. 3A to 3B are schematic cross-sectional views of a manufacturing process of a resistive random access memory according to another embodiment of the present invention. In the present embodiment, the same device as in FIG. 1E will be represented by the same reference number and will not be described again.

Referring to FIG. 3A, in the present embodiment, after the resistive random access memory as shown in FIG. 1E is formed, the interlayer dielectric layer 300 is formed on the substrate 100. The interlayer dielectric layer 300 covers the transistor T, the resistive random access memory structure R and the hardmask layer 110a. The interlayer dielectric layer 300 is, for example, an oxide layer. The forming method of the interlayer dielectric layer 300 is, for example, a chemical vapor deposition process.

Figure 4:
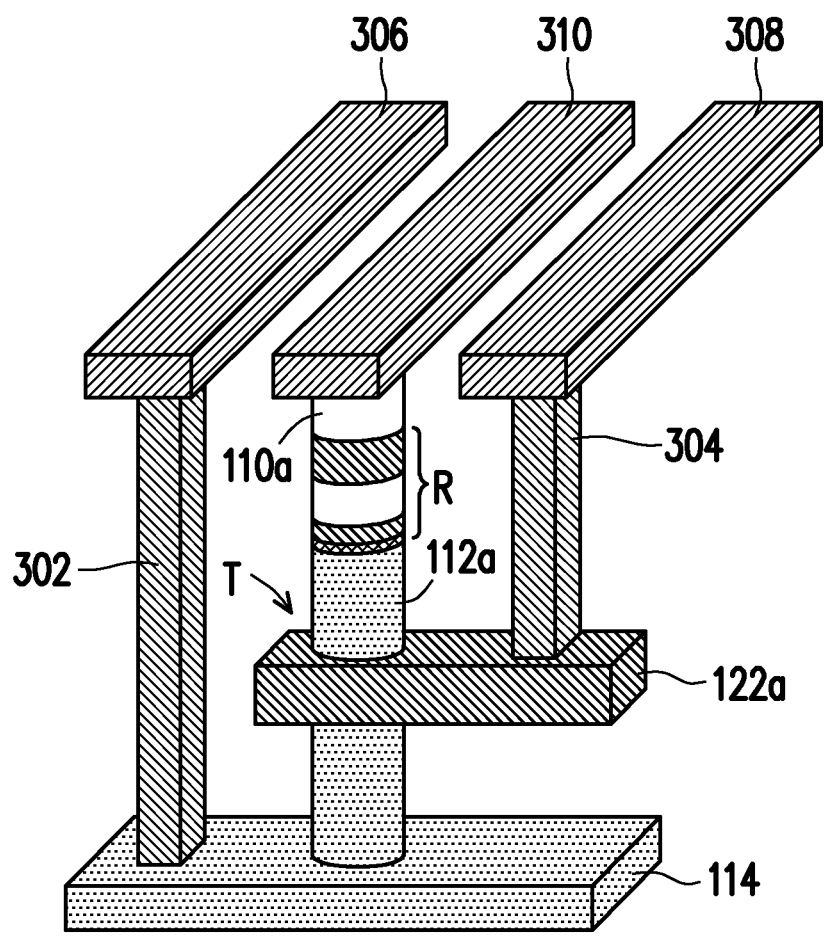
FIG. 4 is a three-dimensional view of the resistive random access memory in FIG. 3B.

Referring to FIG. 3B, the contact 302 connected to the doped region 114 in the substrate 100 and the contact 304 connected to the conductive layer 122a mat be formed in the interlayer dielectric layer 300. Then, the conductive line 306, the conductive line 308 and the conductive line 310 respectively connected to the contact 302, the contact 304 and the hardmask layer 110a may be formed on the interlayer dielectric layer 300. In this way, the manufacture of the resistive random access memory 20 of the present embodiment is completed. FIG. 4 is a three-dimensional view of the resistive random access memory 20. In FIG. 4, for the purpose of clarity of the drawing and ease of description, the substrate 100, the protective layer 116a, the dielectric layer 118a and the oxide layer 120 are not shown. As shown in FIGS. 3B and 4, the conductive line 306 is electrically connected to the doped region 114 (the source) through the contact 302, and therefore may be used as a source line. The conductive line 308 is electrically connected to the conductive layer 122a (the gate) through the contact 304, and therefore may be used as a select line. In addition, in the present embodiment, since the hardmask layer 110a is a conductive layer, the conductive line 310 is electrically connected to the resistive random access memory structure R and the doped region 112a (the drain) through the hardmask layer 110a, and therefore may be used as a bit line.

In addition, in an embodiment where the hardmask layer 110a is an insulating layer, since the conductive line 310 cannot be electrically connected to the resistive random access memory structure R and the doped region 112a (the drain) through the hardmask layer 110a, in the step described in FIG. 3B, before forming the contact 302 and the contact 304, a part of the interlayer dielectric layer 300 and the hardmask layer 110a are removed. The method for removing the part of the interlayer dielectric layer 300 and the hardmask layer 110a is, for example, to perform a chemical mechanical planarization (CMP) process until the top surface of the second electrode 108a is exposed. In this way, the conductive line 310 may be electrically connected to the resistive random access memory structure R and the doped region 112a (the drain) through the second electrode 108a.

It will be apparent to those skilled in the art that various modifications and variations may be made to the disclosed embodiments without departing from the scope or spirit of the invention. In view of the foregoing, it is intended that the invention covers modifications and variations provided that they fall within the scope of the following claims and their equivalents.

What is claimed is:

1. A resistive random access memory, comprising:
a substrate, having a pillar protruding from a surface of the substrate;
a gate, surrounding a part of a side surface of the pillar;
a gate dielectric layer, disposed between the gate and the pillar;
a first electrode, disposed on atop surface of the pillar;
a second electrode, disposed on the first electrode;
a variable resistance layer, disposed between the first electrode and the second electrode;
a first doped region, disposed in the pillar below the gate and in a part of the substrate below the pillar;
a second doped region, disposed in the pillar between the gate and the first electrode; and
a metal silicide layer disposed between the pillar and the first electrode.

2. The resistive random access memory of claim 1, wherein the metal silicide layer comprises a titanium silicide layer, a tungsten silicide layer, a tantalum silicide layer, a molybdenum silicide layer, a cobalt silicide layer, a nickel silicide layer or a combination thereof.

3. The resistive random access memory of claim 1, further comprising a contact connecting the first doped region.

4. The resistive random access memory of claim 1, further comprising a contact connecting to the gate.

5. The resistive random access memory of claim 1, wherein a material of the first electrode comprises Ti, Ta, TiN, TaN, TiAlN, TiW, Pt, Ir, W, Ru, graphite or a combination thereof.

6. The resistive random access memory of claim 1, wherein a material of the second electrode comprises Ti, Ta, TiN, TaN, TiAlN, TiW, Pt, Ir, W, Ru, graphite or a combination thereof.

7. The resistive random access memory of claim 1, wherein a material of the variable resistance layer comprises TaO, $HfO_2$, $ZrO_2$, HfZrO, HfAlO, HfON, HfSiO, HfSrO, HfYO or a combination thereof.

8. The resistive random access memory of claim 1, wherein a material of the gate comprises metal or doped polysilicon.

9. The resistive random access memory of claim 1, further comprising a hardmask layer disposed on the second electrode.

10. The resistive random access memory of claim 9, wherein the hardmask layer comprises a titanium nitride layer, a tantalum nitride layer or a combination thereof.

11. A manufacturing method of a resistive random access memory, comprising:
forming a metal layer on a substrate;
performing a heat-treatment on the metal layer to form a metal silicide layer;

forming a first conductive layer, a variable resistance material layer, a second conductive layer and a hardmask material layer sequentially on the metal silicide layer;

patterning the substrate, the metal silicide layer, the first conductive layer, the variable resistance material layer, the second conductive layer and the hard mask material layer to form a pillar protruding from a surface of the substrate, a resistive random access memory structure on the pillar and a hardmask layer on the resistive random access memory structure; and forming a gate structure surrounding a part of a side surface of the pillar, a first doped region in the pillar under the gate structure and in a part of the substrate under the pillar, and a second doped region in the pillar between the gate structure and the resistive random access memory structure, to form a nanowire transistor, wherein the nanowire transistor is electrically connected to the resistive random access memory structure.

12. The manufacturing method of the resistive random access memory of claim 11, wherein the method for forming the nanowire transistor comprises:

implanting dopants in the substrate before forming the first conductive layer to form the second doped region after the patterning process;

implanting dopants in a lower portion of the pillar and in a portion of the substrate under the pillar after forming the pillar to form the first doped region;

forming a dielectric layer covering the lower portion of the pillar on the substrate;

forming an oxide layer on a exposed side surface of the pillar; and forming a third conductive layer on the dielectric layer, wherein the third conductive layer surrounds the oxide layer under the second doped region.

13. The manufacturing method of the resistive random access memory of claim 12, wherein the method for forming the oxide layer comprises a thermal oxidation process.

14. The manufacturing method of the resistive random access memory of claim 12, wherein the method for forming the third conductive layer comprises:

forming a conductive material layer covering the pillar on the dielectric layer; and patterning the conductive material layer.

15. The manufacturing method of the resistive random access memory of claim 12, wherein the method for forming the dielectric layer comprises:

forming a protective layer on the side surface of the pillar, the side surface of the resistive random access memory structure and the surface of the substrate after forming the first doped region;

forming a dielectric material layer on the substrate, wherein the dielectric material layer covers the pillar, the resistive random access memory structure and the hardmask layer; and removing a part of the dielectric material layer and a part of the protective layer to expose a part of the side surface of the pillar.

16. The manufacturing method of the resistive random access memory of claim 11, further comprising, after forming the nanowire transistor:

forming an interlayer dielectric layer on the substrate, wherein the interlayer dielectric layer covers the nanowire transistor, the resistive random access memory structure and the hardmask layer; and forming a first contact connecting the first doped region in the substrate and a second contact connecting the gate structure in the interlayer dielectric layer.

* * * * *